(12) United States Patent
Kashima et al.

(10) Patent No.: US 6,570,189 B1
(45) Date of Patent: May 27, 2003

(54) SEMICONDUCTOR DEVICE AND METHOD OF MANUFACTURING THE SAME

(75) Inventors: Yasumasa Kashima, Tokyo (JP); Tsutomu Munakata, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/454,609

(22) Filed: Dec. 7, 1999

(30) Foreign Application Priority Data

Mar. 3, 1999 (JP) .......................................... 11-056166

(51) Int. Cl.[7] .............................................. H01L 33/00
(52) U.S. Cl. .............................. 257/94; 257/84; 257/81; 257/96; 257/98; 257/190
(58) Field of Search .................. 257/190, 98, 96, 257/94, 84, 81

(56) References Cited

U.S. PATENT DOCUMENTS

| | | | | |
|---|---|---|---|---|
| 4,758,535 A | * | 7/1988 | Sakakibara et al. | 437/129 |
| 5,179,040 A | * | 1/1993 | Hattori | 437/129 |
| 5,253,264 A | * | 10/1993 | Suzuki et al. | 372/46 |
| 5,585,957 A | * | 12/1996 | Nakao et al. | 359/248 |
| 5,847,415 A | * | 12/1998 | Sakata | 257/96 |

FOREIGN PATENT DOCUMENTS

| | | | | |
|---|---|---|---|---|
| EP | 310019 A2 | * | 9/1988 | H01L/33/00 |
| JP | 59-48968 A | * | 3/1984 | H01L/33/00 |
| JP | 63-216388 A | * | 9/1988 | H01L/33/00 |
| JP | 05-121721 | * | 5/1993 | H01L/27/15 |
| JP | 07-22646 A | * | 1/1995 | H01L/33/00 |

OTHER PUBLICATIONS

"InGaAsP Multiple Quantum Well Edge–Emitting Light-Emitting Diode Showing Low Coherence Characteristics Using Selective–Area Metalorganic Vapor Phase Epitaxy" by Yasumasa Kashima, Tsutomu Munakata and Akio Matoba, in Optical Review vol. 4, No. 1A (1997).

* cited by examiner

Primary Examiner—Wael Fahmy
Assistant Examiner—Wai-Sing Louie
(74) Attorney, Agent, or Firm—Junichi Mimura

(57) ABSTRACT

A semiconductor device includes a substrate formed of a group III element and a group V element, a buffer layer having a thickness of at least 0.5 μm covering an the entire main surface of the substrate, and a selective-area growth layer grown selectively on the buffer layer. The buffer layer includes both the group III element and the group V element. The buffer layer is formed by metalorganic vapor-phase epitaxy.

5 Claims, 2 Drawing Sheets

SEMICONDUCTOR DEVICE AND METHOD OF MANUFACTURING THE SAME

CROSS-REFERENCE TO RELATED APPLICATION

This application claims the priority benefit of Japanese Patent Application No. 11-056166, filed Mar. 3, 1999, the entire subject matter of which is incorporated herein of reference.

BACKGROUND OF THE INVENTION

1. Field of the Invention

The invention relates to an optical semiconductor device such as an integrated semiconductor laser, or a light emitting diode, more particularly, to a structure and a method for manufacturing an emitting layer structure.

2. Description of the Related Art

In the related art in this field, an emitting layer in a light emitting diode (LED) is formed by using the technology called selective-area metalorganic vapor phase epitaxial growth. A method for forming the emitting layers is described in "InGaAsp Multiple Quantum Well Edge-Emitting Light-Emitting Diode Showing Low Coherence Characteristics Using Selective-Area Metalorganic Vapor Phase Epitaxy" by Y. Kashima, T. Munakata and A. Matoba, which was published in Optical Review, Vol. 4, No. 1A, PP69–71, 1997.

In the publication mentioned above, the emission layer in the LED is formed by successively.
(1) Patterning a $SiO_2$ layer on an n-InP substrate,
(2) Forming a selective-area growth layer on the substrate by metalorganic vapor-phase epitaxy (MOVPE),
(3) Removing the SiO2 layer to expose the substrate,
(4) Forming a mesa structure from the selective-area growth layer,
(5) Forming a current blocking layer on the exposed surface,
(6) Forming a contact layer, and
(7) Forming an electrode.

In the step (2) listed above, first, an n-InP buffer layer is selectively grown on portions of the n-InP substrate remaining exposed after the $SiO_2$ patterning, and then an InGaAsP multiple quantum well layer and a p-InP cladding layer are grown on the n-InP buffer layer. However, if the InGaAsP multiple quantum well layer is grown above the InP substrate which has a physical distortion, a crystal dislocation at an interface will be occurred in the InGaAsP multiple quantum well layer. In a test conducted for 2000 hours at 125° C. on an LED having such a crystal dislocation, the output was cut in half. It is found that the crystal dislocation causes the power down of the emission.

To avoid this effect of the physical distortion of the substrate, consideration has been given to increasing the thickness of the buffer layer. However, for two major reasons, it can not be formed in the conventional structure described above.

First, in order to provide a buffer layer having enough thickness, the buffer layer will ordinarily cover the $SiO_2$ mask layer. As a result, it would not be possible to remove the $SiO_2$ mask layer later. Second, the buffer layer having enough thickness can be simply formed by using a thicker $SiO_2$ mask layer. However, the relative location between the light emitting layer and an optical absorption layer behind the light emitting layer will be tilted each other because of the thickness of the buffer layer under the multiple quantum well layer. In this case, the light is not coupled to the optical absorption layer.

The crystal dislocation occurs at the interface between the substrate and the current blocking layer which is formed directly on the substrate if there is some the physical distortion under the current blocking layer. This crystal dislocation might influence the multiple quantum well layer.

SUMMARY OF THE INVENTION

An objective of the invention to provide a semiconductor device having no crystal dislocation in a multiple quantum well layer.

To achieve this objective, the semiconductor device of the invention has a buffer layer which is formed directly on the entire main surface of a substrate.

BRIEF DESCRIPTION OF THE DRAWINGS

The invention will be more particularly described with reference to the accompanying drawings, in which.

DETAILED DESCRIPTION OF THE PREFERRED EMBODIMENT

Figure 1:
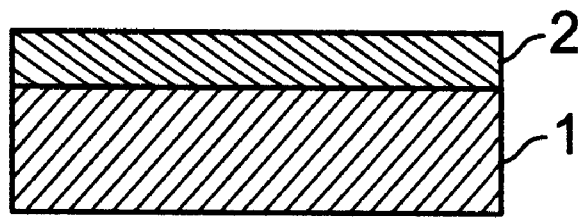
FIGS. 1 through 6 are sectional views showing successive stages in the manufacture of a semiconductor device according to the invention.

Referring to FIG. 1, an n-InP buffer layer 2 having a thickness of 0.5–2 $\mu$m is formed by MOVEP directly over the entire main surface of an n-InP substrate 1 having an [100] plane. Here, precursors for the buffer layer 2 are phosphine ($PH_3$) and trimethylindium (TMI), and disilane ($Si_2H_6$) is used as an n type dopant material. The buffer layer 2 is grown in a 600–700° C. ambient at a growth velocity rate of 1–3 $\mu$m/h. A V/III ratio (a molar ratio of PH3 to TMI) is preferably in the range of 150–250.

Figure 2:
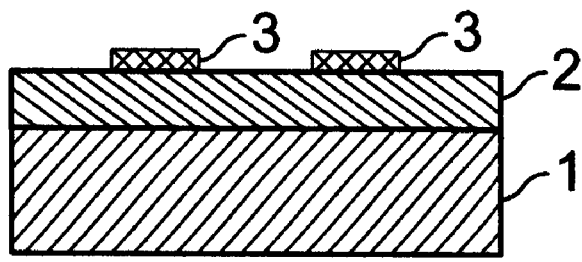

Referring to FIG. 2, a silicon oxide ($SiO_2$) layer is formed over the entire surface of the buffer layer 2 by chemical vapor deposition (CVD). Then, a pair of $SiO_2$ mask strips 3 is formed on the buffer layer 2 by patterning the $SiO_2$ layer with conventional photolithography and etching. Here, each of the $SiO_2$ mask strips 3 extend along an axis [011], and each strip has a width of 10–100 $\mu$m. A selective area between the $SiO_2$ masks strips 3 has a width of 10–50 $\mu$m.

Figure 3:
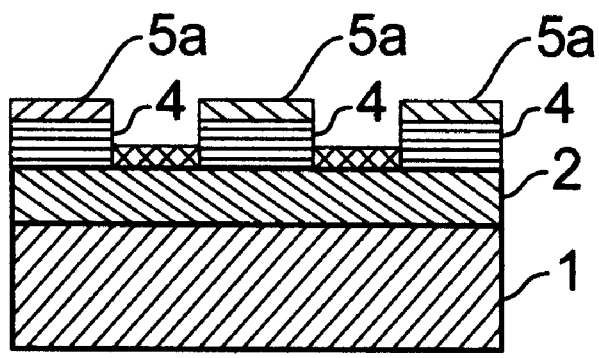

Referring to FIG. 3, an InGaAsP multiple quantum well layer (InGaAsP MQW) 4 and a first cladding layer 5a made of p-InP are selectively grown by MOVPE on the buffer layer 2 as a selective-area growth layer. Here, precursors for the selective-area growth layer are phosphine ($PH_3$), arsine ($H_3As$), trimethylindium (TMI), and triethylgallium (TEG). Further, disilane ($Si_2H_6$) is used as an n type dopant material and dimethylzinc (DMZ) is used as a p type dopant material. The selective-area growth layer is grown in a 600–700° C. ambient at a growth velocity rate of 1–3 $\mu$m/h. A V/III ratio of the precursors is preferably in the range of 150–250.

Figure 4:
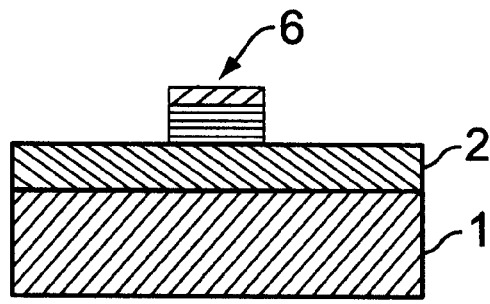

Next, referring to FIG. 4, the mask 3 is removed by etching. After that, a required part of the selective-area growth layer is illustrated in the middle in FIG. 4, and other parts of the selective-area growth layer are removed by etching, leaving a mesa-shaped selective-area growth layer 6 having 2 $\mu$m width on the buffer layer 2.

Figure 5:
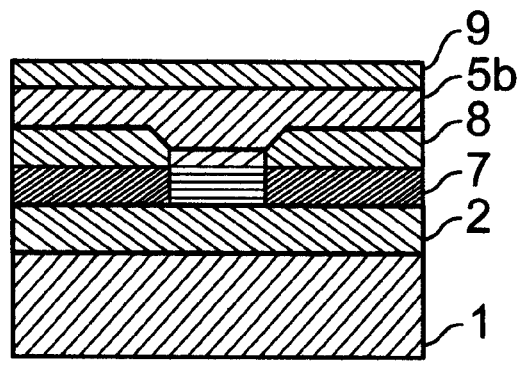

Referring to FIG. 5, a first current blocking layer 7 made of p-InP is formed on the buffer layer 2. Then, an second current blocking layer 8 of n-InP is formed on the first current blocking layer 7. After that, a second cladding layer 5b of p-InP is formed over the entire surface of the device. Then, a contact layer 9 of p-InGaAs is formed on the second cladding layer 5b. These layers are all formed by MOVPE. The above-described process illustrated on FIGS. 1–5 completes a light emitting layer structure.

Figure 6:
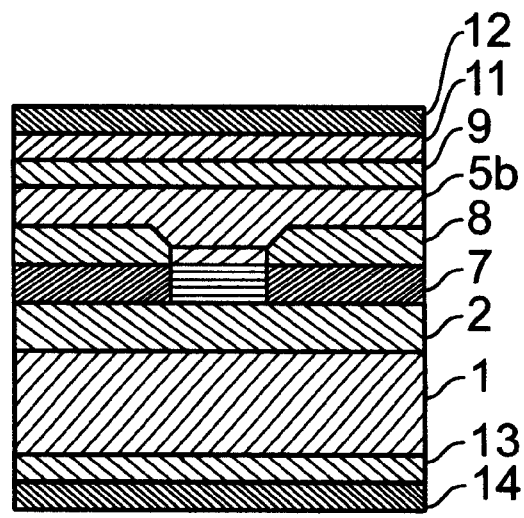

Referring next to FIG. 6, a first contact electrode 11 made of AuZn and a first bonding electrode 12 are then formed on the contact layer 9. After that, a second contact electrode 13 of AuGeNi is formed on the reverse side of the substrate 1, and then, a second bonding electrode 14 is formed on the contact electrode 13. Then, by a dicing process, individual chips are created. One of the chips is mounted on a header, and then, the LED product is completed by performing a bonding process and a packaging process.

Important features of the invention are a the step for forming the n-InP buffer layer 2 directly over the entire main surface of the n-InP substrate with a thickness of 0.5–2 μm. In this thickness range, any distortion formed at the surface of the substrate 1 is not reflect. Therefore, even if there is some distortion at the surface of the substrate 1, such distortion is absorbed by the buffer layer 2. That is, the InGaAsP MQW 4 can be grown with no crystal dislocation on the selective area. Further, as the current blocking layer is formed on the buffer layer 2, not on the substrate, no crystal dislocation occurs in the current blocking layer.

Furthermore, the buffer layer 2 is formed over the entire main surface of the substrate, an optical absorption layer is also formed on the buffer layer 2. Therefore, the optical absorption layer can be disposed behind the light emitting layer if the buffer layer has sufficient thickness.

According to the invention, as the InGaAsP MQW 4 can be grown with no crystal dislocations on the selective area, the deleterious defects that such dislocations have upon LEDs can be avoided.

While the present invention has been described with reference to illustrative embodiments, this description is not intended to be construed in a limiting sense. Various modifications of the illustrated embodiments, as well as other embodiments of the invention, will be apparent to those skilled in the art on reference to this description. For example, if a p-InP substrate is used, a p-InP buffer layer is formed over the entire main surface of the substrate, and then the MQW can be grown on the p-InP buffer layer. Furthermore, the above-described technology can be used for other optical devices such as a semiconductor Laser. Therefore, the appended claims are intended cover any such modifications or embodiments as falls within the true scope of the invention.

What we claim is:

1. A semiconductor device, comprising:

a substrate having a main surface, which is formed of elements from group III and group V, said substrate having a first conductivity type;

an MOVPE buffer layer covering the entire main surface of said substrate, said buffer layer having the same group III and group V elements that are included in said substrate, and said buffer layer having the same conductivity type as that of said substrate;

a selective-area growth layer selectively grown on said buffer layer, said selective-area growth layer having a multiple quantum well layer and a first cladding layer of a second conductivity type, which is formed only on said multiple quantum well layer; and a first current blocking layer having a second conductive type, said first current blocking layer being formed on said MOVPE buffer layer and said first current blocking layer touching to an entire side surface of said multiple quantum well layer and encompassing said multiple quantum well layer;

a second current blocking layer having the first conductive type, formed on said first current blocking layer, said second current blocking layer touching to an entire side surface of said first cladding layer and encompassing said first cladding layer, and a second cladding layer having the second conductivity type, formed on said first cladding layer and said second current blocking layer.

2. A semiconductor device as claimed in claim 1, wherein said multiple quantum well layer is formed of InGaAsP.

3. A semiconductor device as claimed in claim 1, wherein said MOVPE buffer layer has a thickness of at least 0.5 μm.

4. A semiconductor device as claimed in claim 1, wherein said substrate and said MOVPE buffer layer are formed of InP.

5. A semiconductor device as claimed in claim 1, wherein said first current blocking layer is formed of p-type InP, said second blocking layer is formed of n-type InP and said second cladding layer is formed of p-type InP.

* * * * *